United States Patent
Haider et al.

(10) Patent No.: US 9,564,572 B2
(45) Date of Patent: ***Feb. 7, 2017

(54) THERMALLY DRIVEN POWER GENERATOR

(71) Applicant: CAFRAMO LTD., Georgian Bluffs (CA)

(72) Inventors: Viqar Haider, Markham (CA); Michael Tettenborn, Kemble (CA); Anthony Jerzy Solecki, Owen Sound (CA)

(73) Assignee: CAFRAMO LTD., Wiarton (CA)

( * ) Notice: Subject to any disclaimer, the term of this patent is extended or adjusted under 35 U.S.C. 154(b) by 0 days.

This patent is subject to a terminal disclaimer.

(21) Appl. No.: 15/014,514

(22) Filed: Feb. 3, 2016

(65) Prior Publication Data
US 2016/0163952 A1    Jun. 9, 2016

Related U.S. Application Data

(63) Continuation of application No. 13/984,946, filed as application No. PCT/CA2012/050084 on Feb. 15, 2012, now Pat. No. 9,263,661.

(Continued)

(51) Int. Cl.
*H01L 35/02*    (2006.01)
*H01L 35/32*    (2006.01)
(Continued)

(52) U.S. Cl.
CPC ................. *H01L 35/32* (2013.01); *F23D 3/16* (2013.01); *H01L 35/30* (2013.01); *F23C 2203/20* (2013.01); *F23M 2900/13003* (2013.01)

(58) Field of Classification Search
CPC ........................................................ H01L 35/32
(Continued)

(56) References Cited

U.S. PATENT DOCUMENTS

| 3,300,840 A * | 1/1967 | Marshall | ................. H01L 35/08 |
| | | | 136/201 |
| 6,119,463 A * | 9/2000 | Bell | .................... B60H 1/00471 |
| | | | 165/86 |

(Continued)

FOREIGN PATENT DOCUMENTS

WO    03063256    7/2003

OTHER PUBLICATIONS

Canadian Intellectual Property Office as International Searching Authority, International Search Report and Written Opinion on PCT Appln. No. PCT/CA2012/050084, dated May 11, 2012.

(Continued)

*Primary Examiner* — Jayne Mershon
(74) *Attorney, Agent, or Firm* — Gowling WLG (Canada) LLP; Neil Henderson

(57) ABSTRACT

A thermally driven power generator having a base and a heat source placed within the base. The thermally driven power generator further having a heat collector is adapted to collect the heat from the heat source through a plurality of fins and a heat sink adapted to release heat into the environment. The thermally driven power generator further having a thermal electric power generation module is sandwiched between the heat collector and a heat sink; the thermal electric power generation module is designed to convert heat collected by the heat collector to electrical power. A tray assembly for a thermally driven power generator, the tray assembly having: a transport tray; and a magnetic element integrated with the transport tray, the magnetic element designed to attract a wick keeper of a candle such that the wick is held in place.

11 Claims, 16 Drawing Sheets

Related U.S. Application Data

(60) Provisional application No. 61/484,835, filed on May 11, 2011, provisional application No. 61/443,503, filed on Feb. 16, 2011.

(51) Int. Cl.
*H01L 35/30* (2006.01)
*F23D 3/16* (2006.01)

(58) Field of Classification Search
USPC .......................................................... 136/201
See application file for complete search history.

(56) References Cited

U.S. PATENT DOCUMENTS

| | | | |
|---|---|---|---|
| 7,273,981 B2 | 9/2007 | Bell | |
| 2005/0217714 A1* | 10/2005 | Nishijima | F01N 5/025 |
| | | | 136/204 |
| 2010/0154855 A1 | 6/2010 | Nemir et al. | |
| 2011/0200956 A1* | 8/2011 | Franklin | F21S 13/12 |
| | | | 431/292 |

OTHER PUBLICATIONS

European Patent Office, Extended European Search Report on EP Patent Appln. No. 12746940.1, dated Jun. 1, 2014.
United States Patent and Trademark Office, Office Action on U.S. Appl. No. 13/984,946, dated Jun. 25, 2015.

* cited by examiner

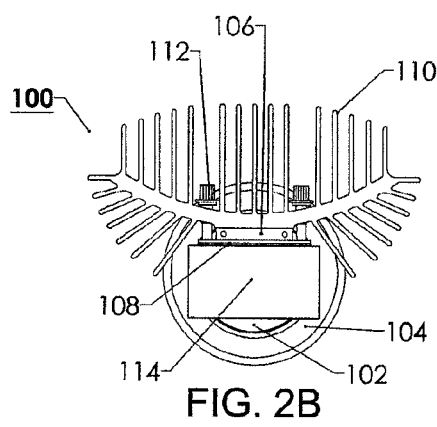
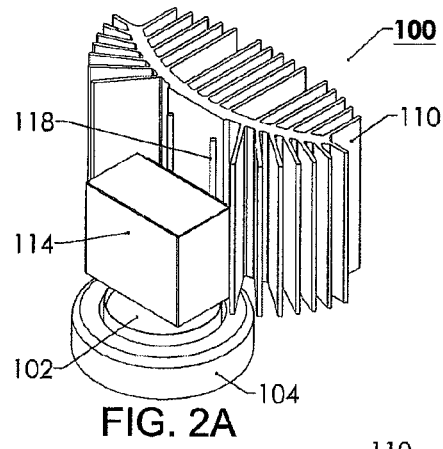
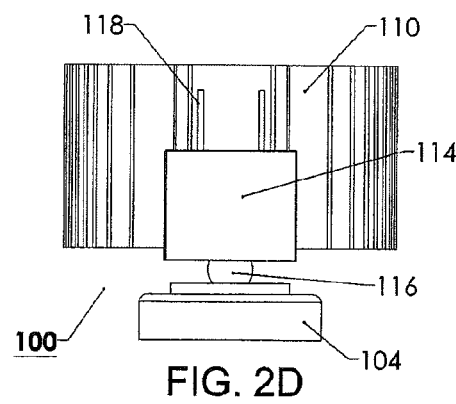
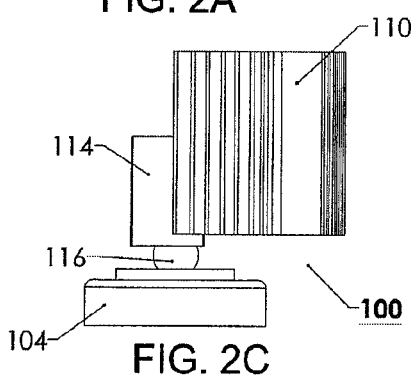
FIG. 2B
FIG. 2A
FIG. 2D
FIG. 2C

| | Collector Design | Power Output (watts) |
|---|---|---|
| A | Conventional Vertical fin | 5.0 |
| B | Conventional Vertical fin with booster | 6.4 |
| C | Round Fin | 7.5 |
| D | Round Fin with booster | 9.0 |
| E | Horizontal Fin | 13.0 |
| F | Horizontal Fin with booster | 14.4 | ness of the present disclosure will now be described, by way of example only, with reference to the attached Figures.

THERMALLY DRIVEN POWER GENERATOR

CROSS REFERENCE TO RELATED APPLICATIONS

This application is a continuation of U.S. patent application Ser. No. 13/984,946, filed on Nov. 22, 2013, which is itself a 371 of PCT Application PCT/CA2012/050084 filed on Feb. 15, 2012, which claims the benefit of priority to U.S. Provisional Patent Application 61/443,503 filed Feb. 16, 2011 and to U.S. Provisional Patent Application 61/484,835 filed May 5, 2011, which are all hereby incorporated by reference in their entirety.

FIELD

The present disclosure relates generally to a thermally driven electrical power generator and, more particularly, to a small scale thermal power generator for powering small electric or electronic devices.

BACKGROUND

Thermoelectric power generators use heat to generate electricity in order to electric or electronic devices. Smaller scale thermoelectric power generator systems may be useful during power outage situations or in environments where other conventional forms of electricity, such as batteries, are not available and may also aid in reducing one's electricity consumption.

Conventional systems, wherein a candle flame is used to produce heat to generate the power, have often had trouble producing enough heat to provide adequate power to operate electronic devices. For example, without adequate power, a light may fail to turn on or may be too faint to use as effective lighting.

SUMMARY

It is, therefore, desirable to provide an improved system for converting heat energy into electricity.

In a first aspect, the present disclosure provides a thermally driven power generator having: a base; a heat source placed within the base; a heat collector adapted to collect the heat from the heat source through a plurality of fins; a heat sink adapted to release heat into the environment; and a thermal electric power generation module sandwiched between the heat collector and a heat sink, wherein the thermal electric power generation module is designed to convert heat collected by the heat collector to electrical power.

In some cases, the heat collector includes a plurality of horizontal fins. In some specific cases, the heat collector is round and the plurality of fins radiate outward to a thicker collecting wall.

In some cases, the heat collector also has a flame aperture through all or a subset of the plurality of fins. In some of these cases, the flame aperture is a tapered aperture.

In some cases, the flame aperture does not contact the heat source.

In some cases, the thermally driven power generator further includes a heat shield designed to fit around at least part of the heat collector.

In some cases, the heat shield is designed to be larger than the heat collector to allow for an air gap between the heat shield and the heat collector. In some cases, the air cap is between 1 and 10 millimeters and in other cases the air cap is between 1 and 3 millimeters.

In some case, the thermally driven power generator further has at least one opening in the base of the thermally driven power generator.

In some case, the thermally driven power generator further has at least one bimetal strip designed to close the at least one opening based on the operating temperature of the thermally driven power generator.

In another aspect, there is provided a tray assembly for a thermally driven power generator, the tray assembly having: a transport tray; and a magnetic element integrated with the transport tray, the magnetic element designed to attract a wick keeper of a candle such that the wick is held in place.

In yet another aspect, there is provided a thermally driven power generator having: a base; a tray assembly comprising: a transport tray; and a magnetic element integrated with the transport tray, the magnetic element designed to attract a wick keeper of a candle such that the wick is held in place; a candle placed within the base; a heat collector adapted to collect the heat from the candle through a plurality of fins, wherein a flame of the candle is placed below an aperture within a subset of the plurality of fins; a heat shield designed to slightly larger than the heat collector and designed fit around at least part of the heat collector leaving an air gap between the heat shield and the heat collector; a heat sink comprising a plurality of cooling fins; a thermal electric power generation module sandwiched between the heat collector and a heat sink, wherein the thermal electric power generation module is designed to convert heat collected by the heat collector to electrical power.

In some cases, the thermally driven power generator further includes at least one opening in the base of the thermally driven power generator.

In some cases, the thermally driven power generator also includes at least one bimetal strip designed to close the at least one opening based on the operating temperature of the thermally driven power generator.

Other aspects and features of the present disclosure will become apparent to those ordinarily skilled in the art upon review of the following description of specific embodiments in conjunction with the accompanying figures.

BRIEF DESCRIPTION OF FIGURES

Embodiments of the present disclosure will now be described, by way of example only, with reference to the attached Figures.

FIGS. 2A to 2D illustrate a perspective view, a top view, a side view and front view of the thermally driven power generator of FIG. 1;

DETAILED DESCRIPTION

Generally, the present disclosure provides a thermally driven power generator. The thermally driven power generator works with a heating component, such as a tea light, candle, small lantern with flammable wick or other combustion source, which provides heat for the thermally driven power generator. The thermally driven power generator creates electrical power by converting thermal energy into electricity using a thermal electric power generation module. The thermal electric power generation module converts thermal energy into electrical energy using the Seabeck effect. As the thermal electric power generation module, typically a flat device, is exposed to a temperature differential between two surfaces, for example a front or hot side and a back or cool side, the thermal electric power generation module converts that heat energy into electricity. This electrical energy is then intended to be used to power any of a wide variety of devices including, for example, lamps, battery chargers and cell phones. The thermally driven power generator can power any electrical device as long as enough electrical power is generated to operate the specific device. Alternatively, the thermally driven power generator may be used to recharge a battery.

The thermally driven power generator embodiments described herein are intended to work with a typical tea light candle but could be easily modified to work with other flames or heat sources. The embodiments described are intended to improve the amount of heat energy extracted by the thermally driven power generator and converted into electrical energy.

Figure 1:
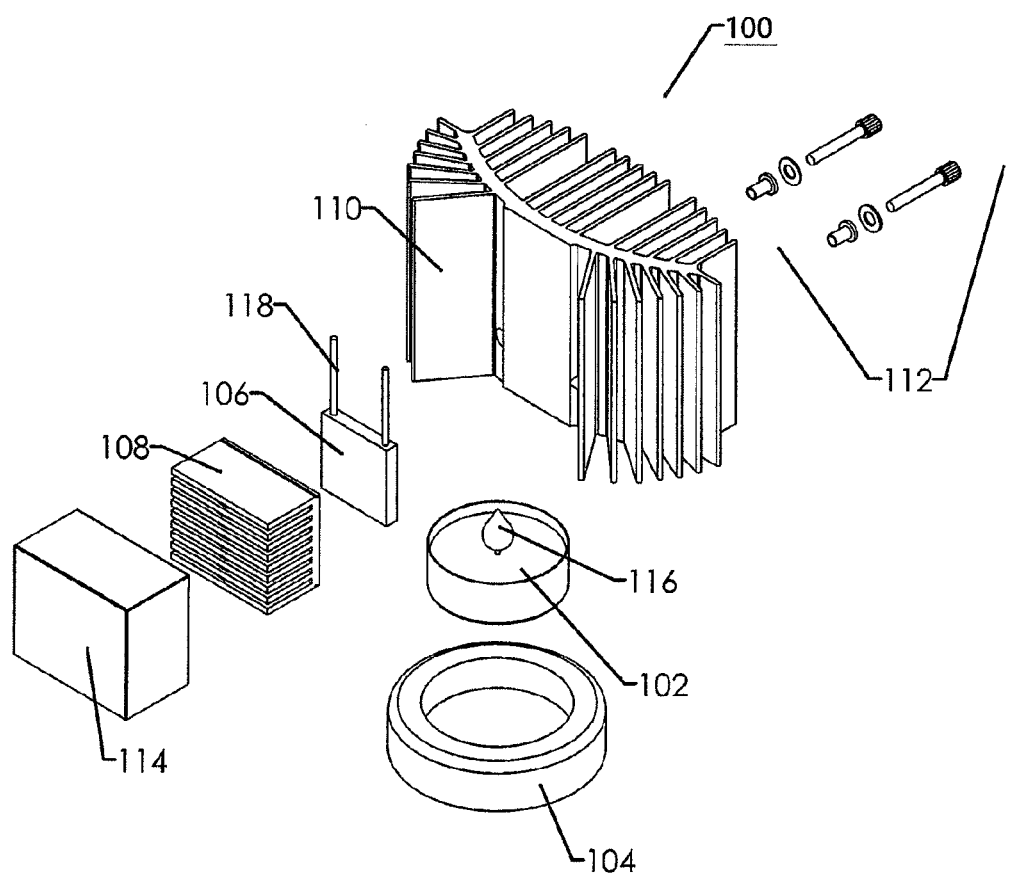
FIG. 1 is an exploded view of an embodiment of a thermally driven power generator.
Figure 3C:
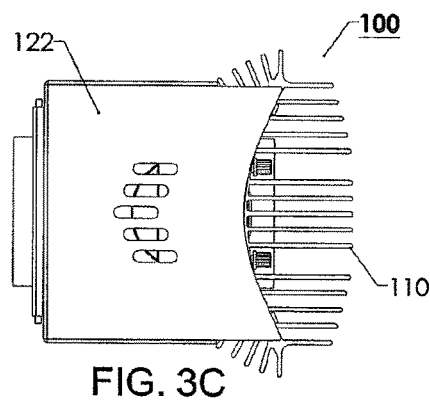
FIGS. 3A to 3D illustrate views of a thermally driven power generator within a housing.
Figure 3A:
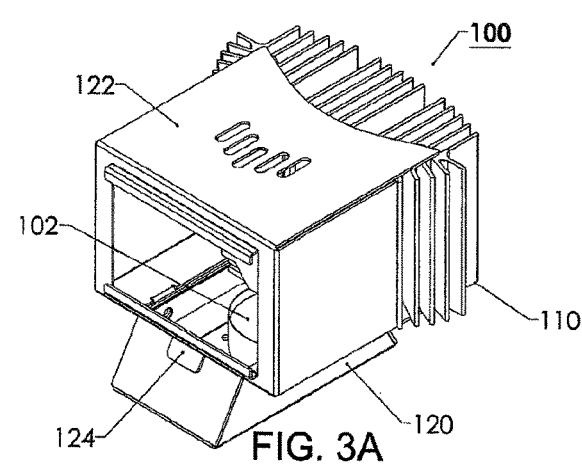
Figure 3D:
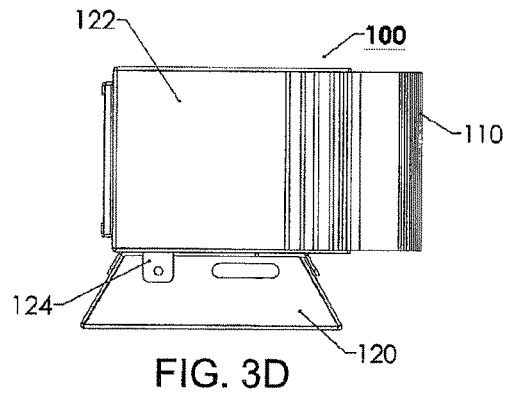
Figure 3B:
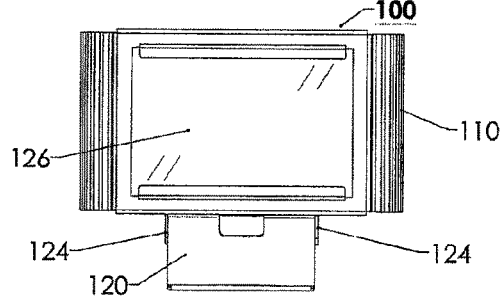

FIG. 1 illustrates an exploded view of a thermally driven power generator (100). The thermally driven power generator (100) is shown with a heat source such as a tea light candle (102) in a housing (104).

A thermal electric power generation module (TEG module) (106) is sandwiched between a heat collector (108) and a heat sink (110). This arrangement is fastened together by fasteners (112), for example, screws or adhesive, and is intended to ensure the TEG module (106) is tightly clamped between the heat collector (108) and heat sink (110). The tightness of the arrangement is intended to ensure good conductive heat transfer between the components of the thermally driven power generator (100). In some cases, a heat transfer duct, such as a heat shield (114) or heat booster may be placed over the heat collector (108), which is intended to increase the amount of heat extracted from the tea light candle. The tea light candle (102) is placed under the heat collector (108) and when the tea light candle (102) is lit the heat collector (108) collects the heat from the flame (116). The heat sink (110) dissipates heat to the environment through natural convection and radiation. Once a temperature differential occurs across the TEG module (106), heat flow causes electrical power, which becomes available from at least one TEG connector (118), for example a pair of wires.

An external cooling fan (not shown) may be used to provide forced convection over the heat sink (110) to improve heat dissipation. This fan could be powered by the TEG. It would be beneficial to add a fan if the increase seen in power generation was greater than the added power needed to operate the fan.

FIGS. 2A to 2D illustrate various views of the thermally driven power generator (100). From the perspective view shown in FIG. 2A, the tea light candle (102) can be seen resting in the housing (104). The tea light candle (102), or another combustion source, can sit such that a flame (116) is directed into the heat collector (108). From the top view in FIG. 2B, the at least one TEG connector (118) is shown where the thermally driven power generator (100) may connect to a light or other electronic device. FIG. 2C illustrates a side view of the thermally driven power generator (100) while FIG. 2D illustrates the front of the thermally driven power generator (100).

FIGS. 3A to 3D illustrate various views of the thermally driven power generator (100). The thermally driven power generator (100) consists of a base (120), and a body (122). The base (120) may be connected to the body (122) via fasteners such as screws or adhesive. The heat sink (110) may be designed or configured to fit into a rear or back opening on the body (122). The heat sink (110) may fit into the rear opening and be held in this opening frictionally, or may be attached via fasteners such as screws or adhesive, or through small hooks incorporated into the body (122). Protrusions (124) may extend from at least two sides of the body (122) and may include an aperture that is configured to align with a second aperture on the base (120). A fastener (not shown), such as a screw or nut and bolt, may attach through the apertures attaching the base to the body.

The body (122) of the thermally driven power generator (100) may further include a grate or cover (126). The cover (126) may block access to the flame or candle when the apparatus is in use. The cover may be opened to light a combustion source such as the tea light (102) or replace the combustion source with a new one.

The effectiveness of the thermally driven power generator (100) is directly related to how much heat is collected by the heat collector (108). As much heat as possible is designed to be transferred from the heat collector (108) to the TEG module (106) and then dissipated by the heat sink (110). The ideal would be to have a 100% efficient heat collector and 100% efficient heat sink. As well, the TEG module should convert as much heat energy into electricity as possible. To date, typical TEG modules convert approximately 4%-6% of heat energy into electrical energy. Some modules have been designed to be more efficient but often rely on expensive materials and may require extreme temperatures much greater than can be collected from a typical tea candle or other small flame.

During experimentation, it was noted that a typical tea candle has a flame which produces about 20 to 25 watts of heat energy. Candles with thicker and longer wicks typically produce more energy. The wax used may also have an effect on the amount of power produced. The experimentation and statistical modeling for the thermally driven power generator (100) relied upon an estimate of a 22 watt candle. It should be noted that the power from a typical tea light candle may vary from over 30 watts to nearly 0 watts as the candle flame dies down.

Figure 4:
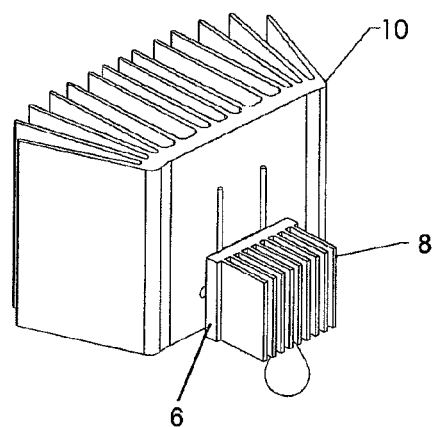
FIG. 4 illustrates a perspective view of a conventional thermally driven power generator.

A heat collector (8) is shown in FIG. 4. Typical heat collectors often consist of an extruded aluminum collector with a plurality of vertical fins. The heat collector (8) of this embodiment of a thermally driven power generator was able to collect approximately 5 watts of heat power from an approximately 22 watt flame, which results in about 23% efficiency. The heat collector (8) is shown with a heat sink (10) and a TEG module (6).

Figure 5:
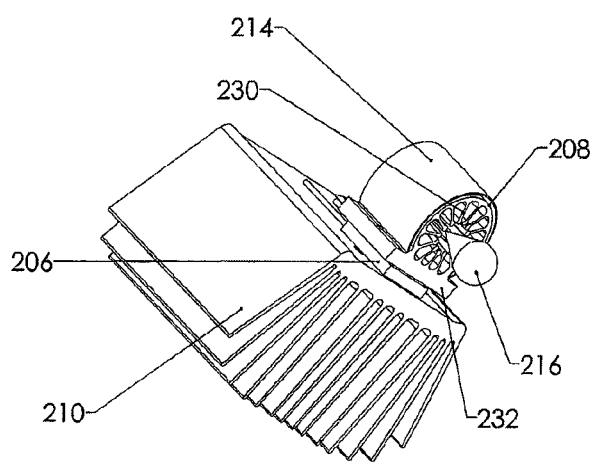
FIG. 5 illustrates one embodiment of a heat collector.

Another embodiment of a heat collector (208) is illustrated in FIG. 5. The heat collector (208) is a round heat collector where a plurality of small fins (230) radiate outward to a thicker collecting wall (232), which is then incorporated as part of the flat plate attached to the TEG module (206). A flame (216) is placed below the plurality of fins (230) and then heats the plurality of fins (230). The plurality of fins (230) then conducts the heat energy to a heating plate (232), which is connected to for example, clamped to, the TEG module (206). The TEG module (206) is further connected to a heat sink (210). Through experimentation, it was noted that the heat collector (208) yielded about 7.5 watts of power to the TEG module (206) using the same estimate of a 22 watt candle, which amounts to approximately 34% efficiency.

Figure 6:
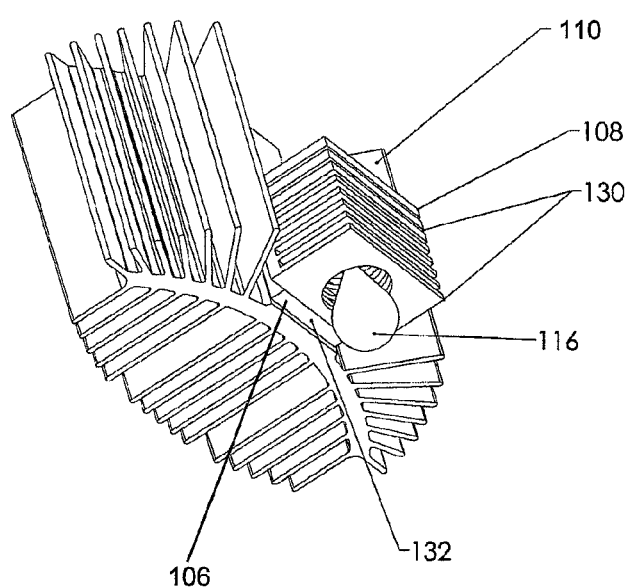
FIG. 6 illustrates an alternative embodiment of a heat collector.

Better performance was discovered when the heat collector (108) as shown in detail in FIG. 6, was employed. The heat collector (108) consists of a plurality of horizontal fins (130) and is further described below. Through convection and radiation, the flame (116) heats the plurality of fins (130) these fins (130) transfer the heat to a plate (132) which is attached to the TEG module (106). This design resulted in about 13 watts of the candle's power being delivered to the TEG module (106), which increased the efficiency to almost 60% using the estimate of a 22 watt candle.

Figure 7A:
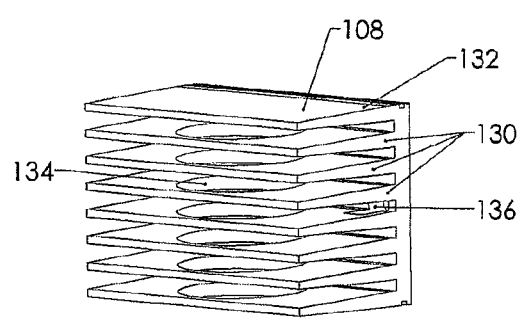
FIGS. 7A to 7B illustrate further views of the heat collector of FIG. 6.
Figure 7B:
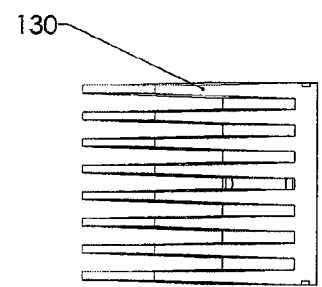

FIGS. 7A and 7B further illustrate the heat collector (108). The heat collector (108) includes the plurality of horizontal fins (130) designed to collect and distribute the heat produced by the flame (116). In some embodiments, the heat collector (108) includes a flame aperture (134) through all or a subset of the plurality of fins (130), preferable the flame aperture (134) ends below a fin located at the top of the heat collector (108). Through experimentation, it has been determined that the flame aperture (134) in the heat collector allows for more heat to be recovered from the flame. As the flame can extend into the flame aperture (134) many of the plurality of fins (130) may receive and distribute more heat from the flame. The flame aperture (134) may be tapered or may have the same diameter through the length of the aperture.

The flame aperture (134) is intended to be large enough to allow the flame (116) to extend through the flame aperture (134) without touching the plurality of horizontal fins (130). Through experimentation, it has been determined that if the flame (116) touches any of the plurality of fins (130) the gasses cool rapidly which may cause debris such as hydrocarbon (soot) to collect on the plurality of fins (130). As the debris builds, the plurality of fins (130) may become insulated and may reduce the heat transfer from the heat collector (108). The debris may also cause an increased wax temperature, as it may retard the heat flow from the candle not allowing the heat to escape from the candle which may result in high wax temperatures where the wax could flash and/or ignite. It was also noted that debris build up may become messy and the heat collector (108) may become difficult to clean.

The heat collector (108) may further include at least one attachment (136) designed to receive the fasteners (112). The heat collector (108) may be made of aluminum or other heat-conductive metal. It will be understood that the fins (130) may not necessarily have the same thickness. For example, as shown in FIG. 6, the fins (130) further away from the flame (116) are thicker than the fins (130) closer to the flame.

In further embodiments, the heat collectors (108, 208) are covered with a heat shield or heat booster. The heat shield is intended to increase efficiency in at least two ways.

1. Improve efficiency by insulating the heat collector. The heat shield may act as a heat barrier to the exposed sides of the heat collector, reflecting radiant heat back to the heat collector and blocking convective heat transfer to the air around the collector.

Figure 8:
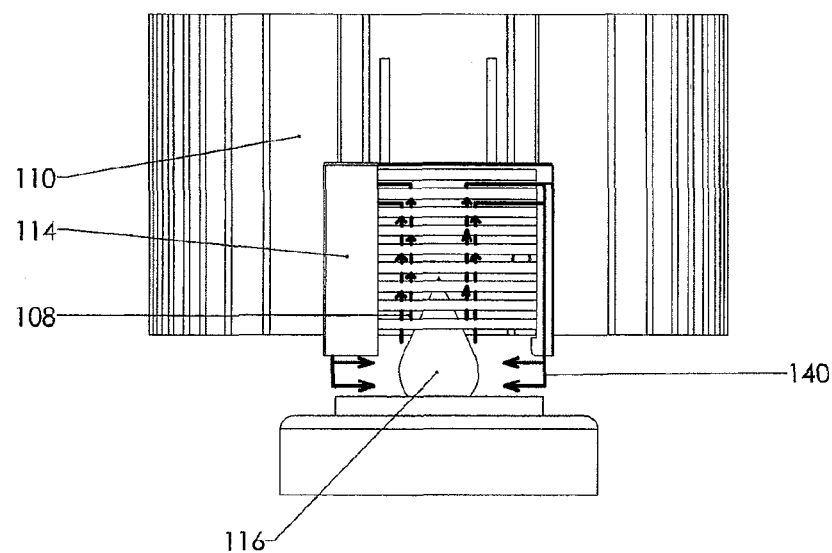
FIG. 8 illustrates air flow created from a heat booster.

2. Improve efficiency by redirecting a portion of the hot and uncombusted gases back to the candle flame (116) as shown by the arrows (140) in FIG. 8. Redirecting these gases back to the flame (116) is intended to increase the flame's power, which increases the heat power delivered to the heat collector (108).

Figure 9:
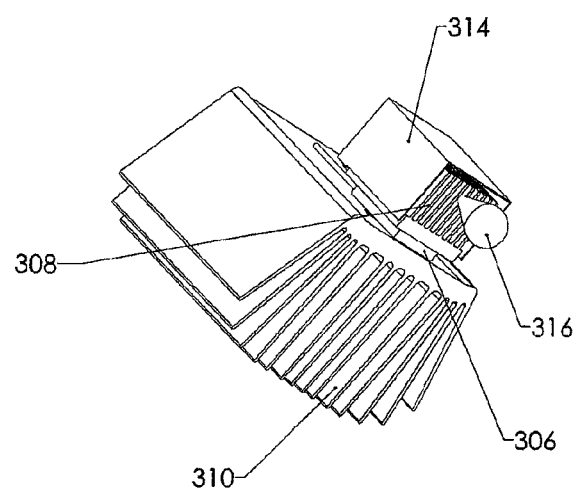
FIG. 9 illustrates one embodiment of a heat booster.

FIG. 9 illustrates an embodiment of a heat booster or heat shield (314), which was tested with a heat collector (308) with a plurality of vertical fins similar to the heat collector shown in FIG. 4. The addition of the heat shield (314) yielded a surprising increase in power delivered to the TEG module (306). The embodiment further included a heat sink (310). The power increased from 5 watts to 6.4 watts in testing when using a flame (316) from a candle with an estimated output of 22 watts. This improved the thermally driven power generator efficiency from 23% to 30%.

Figure 10:
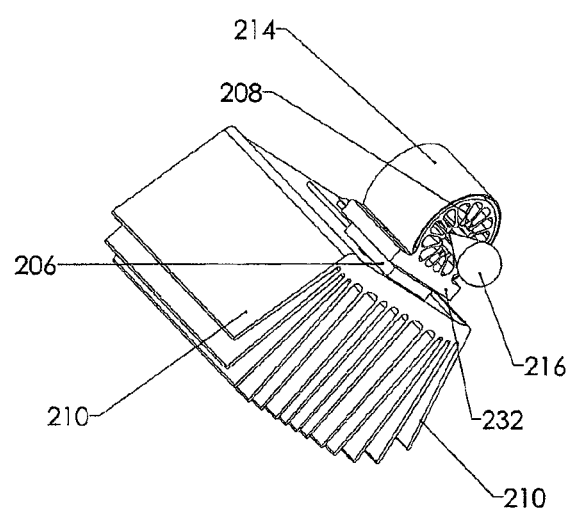
FIG. 10 illustrates an alternative embodiment of a heat booster.

FIG. 10 illustrates another embodiment of a heat shield (214) used on the embodiment of the heat collector (208) shown in FIG. 5. The round heat shield (214) is configured to fit around the round heat collector (208). This improved the round heat collector's input to the TEG from about 7.5 watts to 9 watts, an increase from approximately 34% efficiency to 41% efficiency.

The heat shield may be designed to be slightly larger than the heat collector such that the heat collector fits within the shield with a small air gap surrounding the heat collector. The air gap is believed to improve the heat collected and improve the intensity of the flame, by feeding the warm air back down through the air gap to the flame area. In some cases, the air gap is between 1 and 10 millimeters. In some particular cases, the air gap is between 1 and 3 millimeters. Other types of air gaps or air reflow systems may also be implemented.

Figure 11:
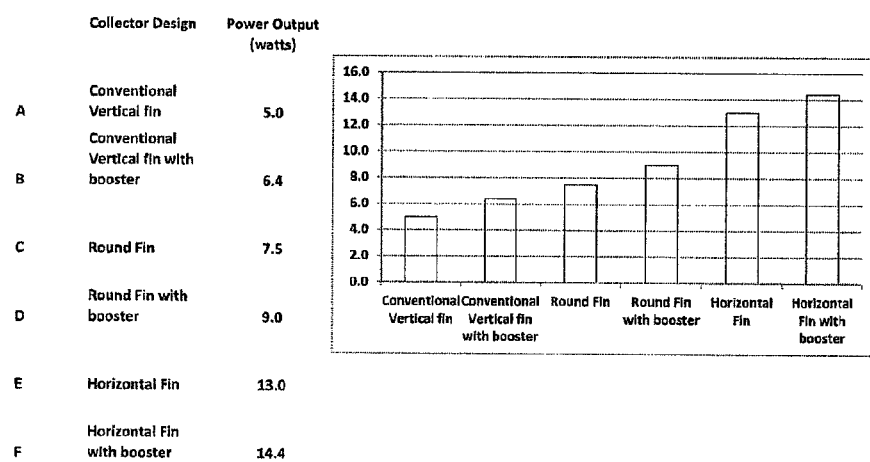
FIG. 11 is a graphical representation of relative changes of the embodiments of the thermally driven power generator.

The heat shield (114) was also tested with the horizontal fin heat collector (108). The addition of the shield (114) to this collector made impressive improvements resulting in 14.4 watts of heat delivered to the TEG module (106), which amounts to about 65% efficiency. A graphical representation of the experimentation results, with and without the heat shield can be seen in FIG. 11.

As previously stated, one way the heat shield aids in heat collection is by insulating the exposed sides of the heat shield from ambient surroundings. The heat shields tested are made from thin sheet stainless steel which acts as a good reflector to keep radiant heat in but does not act as a great insulator to trap convective heat. An insulating cover on top of the stainless steel could be added to improve performance.

Figure 12:
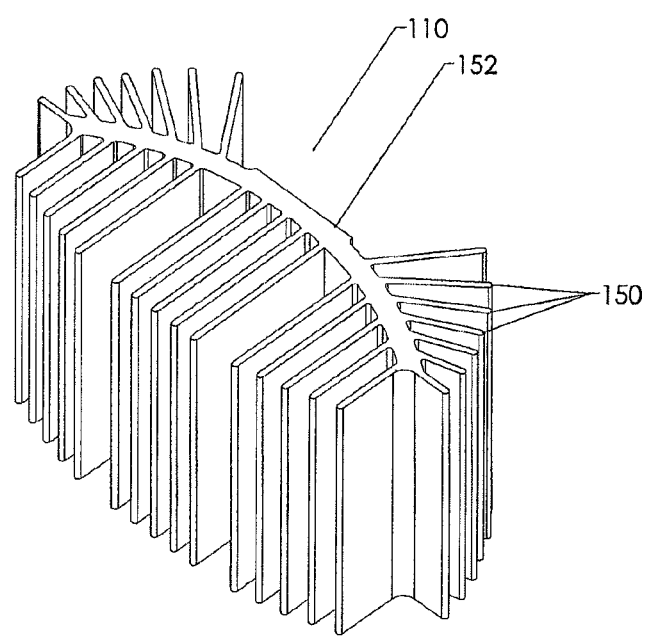
FIG. 12 illustrates a perspective view of a heat sink.

The heat sink (110) is designed with the intent to dissipate as much heat as possible. The heat sink (110) is also designed to ensure manufacturability and to ensure that neither the heat sink nor the thermally driven power generator (100) is too large to be impractical or cost prohibitive. FIG. 12 illustrates a perspective view of the heat sink (110).

The heat sink (110) contains a plurality of cooling fins (150) designed to pull heat away from the thermally driven power generator (100). The cooling fins (150) may be located around the perimeter of the heat radiator except in a mounting area (152), where the heat sink (110) is mounted with the TEG module (106). The cooling fins (150) located on the same side of the perimeter as the mounting area (152), may be angled away from the thermally driven power generator (100). The cooling fins (150) located on the opposite side as the mounting area (152) may extend straight, although in alternative embodiments, may also be angled.

Figure 13A:
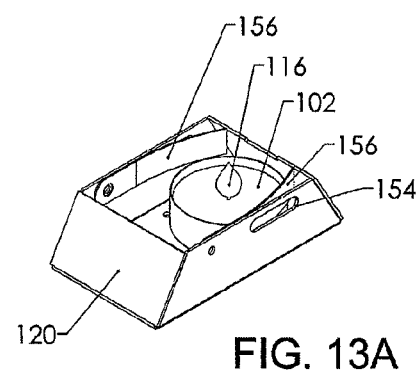
FIGS. 13A and 13B illustrate a choke for a thermally driven power generator.
Figure 13B:
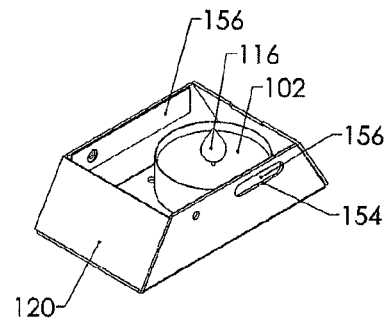

FIGS. 13A and 13B show a safety precaution for the thermally driven power generator (100), which is intended to prevent the base (120) or combustion chamber around the tea candle (102) or other flame from overheating, the amount of incoming combustion air (oxygen) can be limited by closing at least one duct or opening (154) through which the incoming oxygen enters the chamber within the base (120) of the thermally driven power generator (100). By closing at least one duct or opening (154), the amount of combustion may be limited. In one case, bimetal material, which changes shape depending on operating temperatures, may be used to close the at least one opening (154). Those familiar with bimetal materials will understand how these change shape depending on operating conditions. As shown in FIGS. 13A and 13B, two bimetal strips (156) are used. As the operating temperatures increase, the bimetal strips (156) slowly close, which in turn chokes off the oxygen supply. It will be understood that the number of bimetal strips (156) will correspond to the number of openings (154).

In the case of the thermally driven power generator (100) bimetal material can be chosen which restricts the allowable combustion heat energy to that just above the energy available form a standard tea candle. In particular, a tea candle may produce a maximum of about 30 watts of heat. Ensuring that the openings (154) can only provide enough oxygen for the combustion of 40 watts of heat will limit the amount of heat to 40 watts but still allow the candle to operate within normal parameters. Should someone use a modified candle or a different fuel which, when ignited, produces greater than 40 watts of heat available, then the bimetal material strips (156) will detect elevated temperatures and close the corresponding opening (154) limiting the amount of oxygen to the combustion process. Through experimentation, it was noted that when using a higher heat candle, the bimetal strips (156) closed the openings (154) and the higher heat candle or fuel self extinguished.

A snap action bimetal closure or a standard flat piece of bimetal may be used. A snap action piece of bimetal would close suddenly once a design temperature has been reached whereas the standard piece of bimetal will close slowly and uniformly depending on operating temperatures.

Figure 14B:
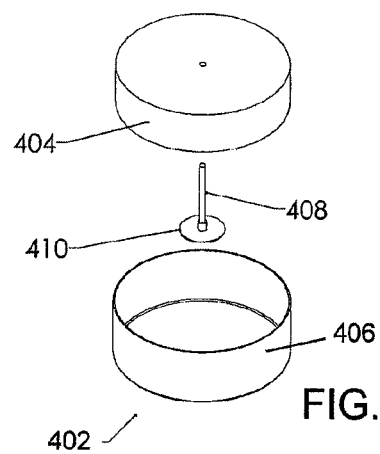
FIGS. 14A and 14B illustrate a conventional tea light candle.
Figure 14A:
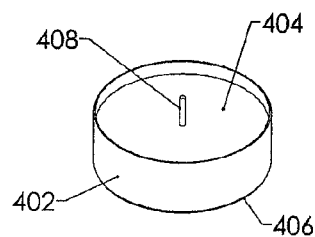

FIGS. 14A and 14B illustrate a conventional tea light candle (402). A tea light candle typically contains wax (404), such as paraffin wax, located within a shell (406), which is typically an aluminum shell. A wick (408) is contained within the wax (404). The wick (408) is typically held in place with a keeper (410), for example, a small metal disk made from steel or the like. The keeper (410) is adapted to hold the wick (408) in an upright position. When the tea light candle (402) is lit, the heat from the flame begins to melt the wax (404). As the wax (404) becomes liquid, the wick (408) and the keeper (410) may begin to move or float within the shell (406). The flame, at the end of the wick may shift in location, get tipped or knocked. The movement of the wick (408) may cause the flame to move away from a preferred location within the thermally driven power generator (100). If the wick and flame have been shifted, less energy may be produced by the thermally driven power generator (100) as less heat may be collect by the heat collector (108).

Figure 15:
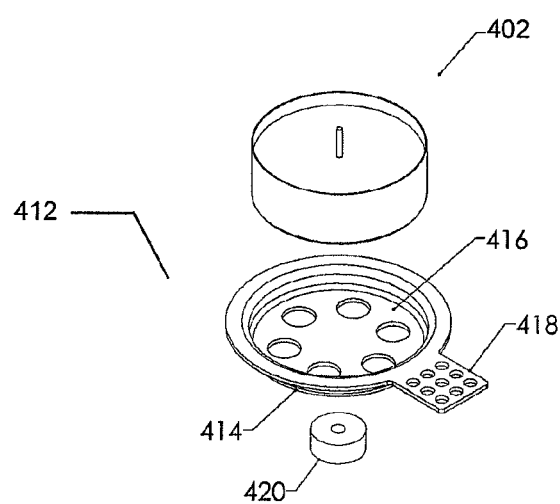
FIG. 15 illustrates an exploded view of a tea light candle and tray assembly.

FIG. 15 illustrates an exploded view of a tea light candle (402) and tray assembly (412). The tray assembly includes a transport tray (414). The transport tray (414) may include a recess (416) designed to receive the tea light candle (402). The transport tray (414) may include apertures, or may be a solid structure. In some cases, the transport tray (414) may include a handle (418), which is designed to allow a user to easily insert and remove the candle (402) from the thermally driven power generator (100).

The transport tray (414) also includes a magnet (420). The magnet may be attached to the underside of the transport tray (414) or may be integrated and incorporated into the transport tray (414). The magnet (420) is designed to be located near or at the center of the recess (416) of the transport tray (414). The magnet (420) is designed to attract the keeper (410), and hold the keeper (410) in place when the wax (404) becomes molten. The keeper (410) will align itself with the magnet, which is intended to reduce the likelihood of the wick (408) and flame being shifted when the thermally driven power generator is in use. If a candle, besides a tea light candle, is used to power the thermally driven power generator, the sizing of the transport tray and the recess may be adapted to receive a larger or smaller candle.

Figures 16A, 16B:
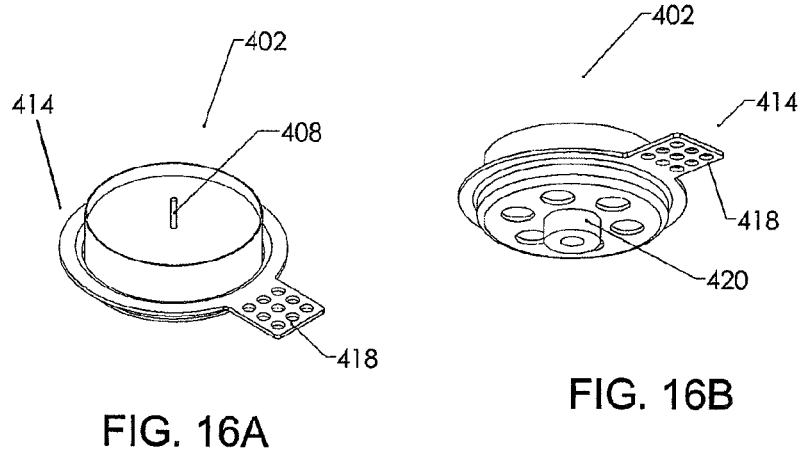
FIGS. 16A and 16B illustrate a top perspective view and a bottom perspective view of a tea light candle tray assembly.

FIGS. 16A and 16B illustrate a top perspective and a bottom perspective view of the tea light candle and transport tray assembly (412). The tea light candle (402) sits in the recess (416) of the transport tray (414). The magnet (420) is located below the keeper (410). The transport tray (414) may be inserted into the thermally driven power generator such that the flame from the wick (408) is intended to be maintained in the same location by the magnetic force between the keeper (410) and the magnet (420).

It will be understood that the tray assembly (412) is not required and the magnet (420) may be placed within the thermally driven power generator (100) at various locations to provide similar functionality. Further, the transport tray (414) may also include mechanisms for adjusting the size of the recess to allow various sizes of candles or fuels to be inserted and positioned appropriately.

In the preceding description, for purposes of explanation, numerous details are set forth in order to provide a thorough understanding of the embodiments. However, it will be apparent to one skilled in the art that these specific details are not required. In other instances, well-known structures are shown in block diagram form in order not to obscure the understanding.

The above-described embodiments are intended to be examples only. Alterations, modifications and variations can be effected to the particular embodiments by those of skill in the art without departing from the scope, which is defined solely by the claims appended hereto.

The invention claimed is:
1. A thermally driven power generator comprising:
a base comprising at least one opening;
a heat source placed within the base;
a heat collector adapted to collect the heat from the heat source through a plurality of fins;
a heat sink adapted to release heat into the environment;
a thermal electric power generation module sandwiched between the heat collector and a heat sink, wherein the thermal electric power generation module is designed to convert heat collected by the heat collector to electrical power; and at least one bimetal strip designed to close the at least one opening in the base, based on the operating temperature of the thermally driven power generator.

2. A thermally driven power generator according to claim 1 wherein the heat collector comprises a plurality of horizontal fins.

3. A thermally driven power generator according to claim 1 wherein the heat collector is round and the plurality of fins radiate outward to a thicker collecting wall.

4. A thermally driven power generator according to claim 2 wherein the heat collector further comprises a flame aperture through all or a subset of the plurality of fins.

5. A thermally driven power generator according to claim 4 wherein the flame aperture is a tapered aperture.

6. A thermally driven power generator according to claim 4 wherein the flame aperture does not contact the heat source.

7. A thermally driven power generator according to claim 1 further comprising a heat shield designed to fit around at least part of the heat collector.

8. A thermally driven power generator according to claim 7 wherein the heat shield is designed to be larger than the heat collector to allow for an air gap between the heat shield and the heat collector.

9. A thermally driven power generator according to claim 8 wherein the air gap is between 1 and 10 millimeters.

10. A thermally driven power generator according to claim 8 wherein the air gap is between 1 and 3 millimeters.

11. A thermally driven power generator comprising:
a base comprising at least one opening;
a tray assembly comprising:
    a transport tray; and
    a magnetic element integrated with the transport tray, the magnetic element designed to attract a wick keeper, of a candle such that the wick is held in place;
a candle placed within the base;
a heat collector adapted to collect the heat from the candle through a plurality of fins, wherein a flame of the candle is placed below an aperture within a subset of the plurality of fins;
a heat shield designed to slightly larger than the heat collector and designed fit around at least part of the heat collector leaving an air gap between the heat shield and the heat collector;
a heat sink comprising a plurality of cooling fins;
a thermal electric power generation module sandwiched between the heat collector and a heat sink, wherein the thermal electric power generation module is designed to convert heat collected by the heat collector to electrical power; and
at least one bimetal strip designed to close the at least one opening based on the operating temperature of the thermally driven power generator.

* * * * *